United States Patent
Roohparvar

(10) Patent No.: US 7,961,522 B2
(45) Date of Patent: Jun. 14, 2011

(54) METHOD AND SYSTEM FOR MINIMIZING NUMBER OF PROGRAMMING PULSES USED TO PROGRAM ROWS OF NON-VOLATILE MEMORY CELLS

(75) Inventor: Frankie Roohparvar, Monte Soreno, CA (US)

(73) Assignee: Micron Technology, Inc., Boise, ID (US)

( * ) Notice: Subject to any disclaimer, the term of this patent is extended or adjusted under 35 U.S.C. 154(b) by 70 days.

(21) Appl. No.: 12/505,886

(22) Filed: Jul. 20, 2009

(65) Prior Publication Data

US 2009/0279363 A1    Nov. 12, 2009

Related U.S. Application Data

(62) Division of application No. 11/506,375, filed on Aug. 18, 2006, now Pat. No. 7,567,461.

(51) Int. Cl.
*G11C 11/34* (2006.01)

(52) U.S. Cl. .......... 365/185.22; 365/185.18; 365/185.09

(58) Field of Classification Search ............ 365/185.22, 365/185.18, 185.09, 185.03, 185.05, 185.14, 365/185.17, 185.23, 185.24, 185.25, 185.26, 365/185.28

See application file for complete search history.

(56) References Cited

U.S. PATENT DOCUMENTS

| | | | |
|---|---|---|---|
| 4,498,151 A | 2/1985 | Henry | 364/900 |
| 5,023,613 A | 6/1991 | Dingwall | 341/118 |
| 5,142,541 A | 8/1992 | Kim et al. | 371/40.2 |
| 5,252,974 A | 10/1993 | Gulczynski | 341/141 |
| 5,268,870 A | 12/1993 | Harari | 365/218 |
| 5,377,145 A | 12/1994 | Kynett et al. | 365/189.05 |
| 5,448,712 A | 9/1995 | Kynett et al. | 395/430 |
| 5,475,693 A | 12/1995 | Christopherson et al. | 371/10.2 |
| 5,513,144 A | 4/1996 | O'Toole | 365/200 |
| 5,513,333 A | 4/1996 | Kynett et al. | 395/430 |
| 5,523,972 A | 6/1996 | Rashid et al. | 365/185.22 |
| 5,544,118 A | 8/1996 | Harari | 365/218 |
| 5,563,827 A * | 10/1996 | Lee et al. | 365/185.23 |
| 5,587,946 A | 12/1996 | Campardo et al. | 365/185.02 |
| 5,621,738 A | 4/1997 | Caywood et al. | 371/21.4 |
| 5,633,822 A | 5/1997 | Campardo et al. | 365/185.02 |
| 5,648,934 A | 7/1997 | O'Toole | 365/200 |
| 5,727,003 A | 3/1998 | Zook | 371/39.1 |
| 5,751,637 A | 5/1998 | Chen et al. | 365/185.33 |
| 5,751,647 A | 5/1998 | O'Toole | 365/200 |
| 5,754,567 A | 5/1998 | Norman | 371/40.18 |
| 5,765,185 A | 6/1998 | Lambrache et al. | 711/103 |
| 5,828,862 A | 10/1998 | Singkornrat et al. | 395/442 |
| 5,862,081 A | 1/1999 | Harari | 365/185.29 |
| 5,881,295 A | 3/1999 | Iwata | 395/735 |
| 5,909,390 A | 6/1999 | Harari | 365/185.03 |

(Continued)

*Primary Examiner* — Dang T Nguyen
(74) *Attorney, Agent, or Firm* — Dorsey & Whitney LLP

(57) ABSTRACT

A flash memory device programs cells in each row in a manner that minimizes the number of programming pulses that must be applied to the cells during programming. The flash memory device includes a pseudo pass circuit that determines the number of data errors in each of a plurality of subsets of data that has been programmed in the row. The size of each subset corresponds to the number of read data bits coupled from the memory device, which are simultaneously applied to error checking and correcting circuitry. During iterative programming of a row of cells, the pseudo pass circuit indicates a pseudo pass condition to terminate further programming of the row if none of the subsets of data have a number of data errors that exceeds the number of data errors that can be corrected by the error checking and correcting circuitry.

22 Claims, 7 Drawing Sheets

U.S. PATENT DOCUMENTS

| | | | |
|---|---|---|---|
| 5,909,449 A | 6/1999 | So et al. | 371/21.4 |
| 5,925,140 A | 7/1999 | Hudson | 714/52 |
| 5,966,723 A | 10/1999 | James et al. | 711/103 |
| 5,991,517 A | 11/1999 | Harari et al. | 395/182.01 |
| 6,141,700 A | 10/2000 | Iwata | 710/3 |
| 6,216,251 B1 | 4/2001 | McGinn | 714/800 |
| 6,247,168 B1 | 6/2001 | Green | 717/1 |
| 6,317,371 B2 | 11/2001 | Katayama et al. | 365/200 |
| 6,421,757 B1 | 7/2002 | Wang et al. | 711/103 |
| 6,426,893 B1 | 7/2002 | Conley et al. | 365/185.11 |
| 6,438,726 B1 | 8/2002 | Walters, Jr. | 714/764 |
| 6,490,201 B2 | 12/2002 | Sakamoto | 365/185.22 |
| 6,498,749 B1 | 12/2002 | Cuppens et al. | 365/185.09 |
| 6,580,638 B2 | 6/2003 | Conley et al. | 365/185.11 |
| 6,601,211 B1 | 7/2003 | Norman | 714/773 |
| 6,683,810 B2 | 1/2004 | Sakamoto | 365/185.22 |
| 6,687,158 B2 | 2/2004 | Yano | 365/185.17 |
| 6,728,164 B2 | 4/2004 | Mori | 365/238.5 |
| 6,754,103 B2 | 6/2004 | Frayer | 365/185.03 |
| 6,760,255 B2 | 7/2004 | Conley et al. | 365/185.11 |
| 6,763,424 B2 | 7/2004 | Conley | 711/103 |
| 6,771,536 B2 | 8/2004 | Li et al. | 365/185.02 |
| 6,799,101 B2 | 9/2004 | Hawig et al. | 701/35 |
| 6,856,551 B2 | 2/2005 | Mokhlesi et al. | 365/185.28 |
| 6,871,257 B2 | 3/2005 | Conley et al. | 711/103 |
| 6,888,758 B1 | 5/2005 | Hemink et al. | 365/185.22 |
| 6,940,917 B2 | 9/2005 | Menon et al. | 375/267 |
| 6,959,365 B2 | 10/2005 | Ootani et al. | 711/152 |
| 6,968,421 B2 | 11/2005 | Conley | 711/103 |
| 6,992,932 B2 | 1/2006 | Cohen | 365/185.2 |
| 6,996,003 B2 | 2/2006 | Li et al. | 365/185.02 |
| 6,996,008 B2 | 2/2006 | Conley et al. | 365/185.11 |
| 7,023,737 B1 | 4/2006 | Wan et al. | 365/185.22 |
| 7,035,146 B2 | 4/2006 | Hemink et al. | 365/185.22 |
| 7,057,939 B2 | 6/2006 | Li et al. | 365/185.28 |
| 7,102,383 B2 | 9/2006 | Roger et al. | 326/39 |
| 7,117,296 B2 | 10/2006 | Hosono et al. | 711/103 |
| 7,120,051 B2 | 10/2006 | Gorobets et al. | 365/185.02 |
| 7,126,854 B2 | 10/2006 | Park | 365/185.18 |
| 7,269,090 B2 | 9/2007 | Baker et al. | 365/230.06 |
| 7,352,630 B2 * | 4/2008 | Lee et al. | 365/185.22 |
| 2004/0125653 A1 * | 7/2004 | Tran et al. | 365/185.22 |
| 2005/0094440 A1 * | 5/2005 | Tu et al. | 365/185.17 |
| 2005/0219909 A1 | 10/2005 | Futatsuyama et al. | 365/185.22 |
| 2005/0248990 A1 * | 11/2005 | Kessenich | 365/185.28 |
| 2006/0171202 A1 | 8/2006 | Kawamoto et al. | 365/185.17 |
| 2007/0074093 A1 * | 3/2007 | Lasser | 714/763 |

* cited by examiner

METHOD AND SYSTEM FOR MINIMIZING NUMBER OF PROGRAMMING PULSES USED TO PROGRAM ROWS OF NON-VOLATILE MEMORY CELLS

CROSS-REFERENCE TO RELATED APPLICATION

This application is a divisional of U.S. patent application Ser. No. 11/506,375, filed Aug. 18, 2006 and issued as U.S. Pat. No. 7,567,461 on Jul. 29, 2009. This application and patent is incorporated by reference herein.

TECHNICAL FIELD

This invention relates to non-volatile memory devices, and, more particularly, to a non-volatile memory device in which the number of programming pulses used to program a row of non-volatile memory cells is limited to the number required to program a sufficient number of cells that any data errors can be corrected by error checking and correcting means.

BACKGROUND OF THE INVENTION

Electrically erasable and programmable memory devices having arrays of flash memory cells are found in a wide variety of electrical devices. A flash memory cell, also known as a floating gate transistor memory cell, is similar to a field effect transistor, having a source region and a drain region that is spaced apart from the source region to form an intermediate channel region. A floating gate, typically made of doped polysilicon, is disposed over the channel region and is electrically isolated from the channel region by a layer of gate oxide. A control gate is fabricated over the floating gate, and it can also be made of doped polysilicon. The control gate is electrically separated from the floating gate by a dielectric layer. Thus, the floating gate is "floating' in the sense that it is insulated from the channel, the control gate and all other components of the flash memory cell.

A flash memory cell is programmed by storing charge on the floating gate. The charge thereafter remains on the gate for an indefinite period even after power has been removed from the flash memory device. Flash memory devices are therefore non-volatile. Charge is stored on the floating gate by applying appropriate voltages to the control gate and the drain or source. For example, a negative charge can be placed on the floating gate by grounding the source while applying a sufficiently large positive voltage to the control gate to attract electrons, which tunnel through the gate oxide to the floating gate from the channel region. The voltage applied to the control gate, called a programming voltage, determines the amount of charge residing on the floating gate after programming.

A flash memory cell can be read by applying a positive control gate to source voltage having a magnitude greater than a threshold voltage. The amount of charge stored on the flash memory cell determines the magnitude of the threshold voltage that must be applied to the control gate to allow the flash memory cell to conduct current between the source and the drain. As negative charge is added to the floating gate, the threshold voltage of the flash memory cell increases. During a read operation, a read voltage is applied to the control gate that is large enough to render the cell conductive if no charge is stored on the floating gate, but not large enough to render the cell conductive if charge is stored on the floating gate. During the read operation, the source is coupled to ground, and a positive voltage is applied through a suitable impedance to the drain, which is used as the output terminal of the cell. Therefore, if the floating gate of the flash memory cell is charged, the drain will remain at the positive voltage. If the floating gate of the flash memory cell is not charged, the cell will ground the drain.

Before a flash memory cell can be programmed, it must be erased by removing charge from the floating gate. The cell can be erased by applying a gate-to-source voltage to the cell that has a polarity opposite that used for programming. Specifically, the control gate is grounded, and a large positive voltage is applied to the source to cause the electrons to tunnel through the gate oxide and deplete the charge from the floating gate. In another approach, a relatively large negative voltage is applied to the control gate, and a positive voltage, such as a supply voltage, is applied to the source region.

A typical flash memory device includes a memory array containing a large number of flash memory cells arranged in rows and columns. Two common types of flash memory array architectures are the "NAND" and "NOR" architectures, so called for the logical form in which the basic flash memory cell configuration for each is arranged. FIG. 1 illustrates a typical NAND flash memory array 10 of conventional design. The array 10 is comprised of a large number of flash memory cells, collectively indicated by reference numeral 14. The array of flash memory cells 14 is typically divided into a number of blocks, one of which is shown in FIG. 1. Each block includes a number of rows, which, in the example shown in FIG. 1, includes 32 rows. The cells 14 in the same row have their control gates coupled to a common word select line 30, each of which receives a respective word line signal WL0-WL31. The cells 14 in the same column having their sources and drains connected to each other in series. Thus all of the memory cells 14 in the same column of each block are typically connected in series with each other. The drain of the upper flash memory cell 14 in the block is coupled to a bit line 20 through a first select gate transistor 24. The conductive state of the transistors 24 in each block are controlled by a source gate SG(D) signal. Each of the bit lines 20 output a respective bit line signal BL1-BLN indicative of the data bit stored in the respective column of the array 10. The bit lines 20 extend through multiple blocks to respective sense amplifiers (not shown). The source of the lower flash memory cell 14 in the block is coupled to a source line 26 through a second select gate transistor 28. The conductive state of the transistors 28 in each block are controlled by a source gate SG(S) signal. The source line 26 receives a signal SL having various magnitudes depending upon whether the memory cells 14 are being programmed, read or erased.

A read operation is performed on a row-by-row basis. When a read operation is to be performed for a selected block, the source line 26 is coupled to ground, and the select gate transistors 24, 28 for that block are turned ON responsive to high SG(D) and SG(S) signals. Also, the bit line 20 for each column is precharged to the supply voltage $V_{CC}$. Finally, a read voltage is applied to a word select line 30 for the selected row, thereby applying the read voltage to the control gates of all of the flash memory cells 14 in that row. As explained above, the magnitude of the read voltage is sufficient to turn ON all flash memory cells 14 that do not have a charged floating gate, but insufficient to turn ON all cells that have a charged floating gate. A voltage having a higher magnitude is applied to the word select lines 30 for all of the non-selected rows. This voltage is large enough to turn ON the flash memory cells 14 even if their floating gates are storing charge. As a result, the bit line 20 for each column will be low if the cell 14 in that column of the selected row is not storing charge. Otherwise the bit line 20 remains high at $V_{CC}$. The voltage on each bit line 20 is compared to a reference voltage by a respective sense amplifier (not shown). If the voltage on the bit line 20 is less than the reference voltage, the sense amplifier outputs a voltage corresponding to a "1" binary value of the read data bit. If the voltage on the bit line 20 is greater than the reference voltage, the sense amplifier outputs a voltage corresponding to a "0" binary value of the read data bit.

The select gate transistors 28 shown in FIG. 1 are NMOS transistors, which are normally fabricated in a p-well (not shown). When a selected row of flash memory cells 14 are to be erased, the word select line 30 for the selected row is coupled to ground, and the p-well is coupled to a positive voltage. The positive voltage is coupled through the PN junction formed by the p-well and the n-doped drain of the select gate transistors 28 to apply the positive voltage to the sources of the flash memory cells 14. The positive voltage then depletes charge from the floating gates in all of the cells 14, thereby erasing all of the memory cells 14 in the selected row. The flash memory cells 14 are normally erased on a block-by-block basis by grounding the word select lines 30 for all of the cells 14 in the block. Insofar as erasing the cells 14 removes charge from their floating gates, erasing the cells 14 effectively programs them to store logic "1" bit values.

When a selected row of cells 14 are to be programmed, a programming voltage is applied to the word select line 30 for the selected row, and a voltage sufficient to turn ON the remaining cells 14 is applied to the control gates of the remaining flash memory cells 14. Also, the first column select transistor 24 is turned ON and voltages corresponding to the data bits that are to be programmed are applied to the respective bit lines. If the voltage of a bit line 20 is at ground corresponding to a logic "0," charge will be stored in the floating gate of the flash memory cell 14 in that column of the selected row. Otherwise, a voltage on the bit line 20 corresponding to a logic "1" prevents any charge from being stored on the floating gate. Programming is therefore performed on a row-by-row basis.

The storage capacity of a flash memory array can be increased by storing multiple bits of data in each flash memory cell 14. This can be accomplished by storing multiple levels of charge on the floating gate of each cell 14. These memory devices are commonly referred to as multi-bit or multi-level flash memory cells, known as "MLC memory cells." In MLC cells, multiple bits of binary data corresponding to distinct threshold voltage levels defined over respective voltage ranges are stored within a single cell. Each distinct threshold voltage level corresponds to a respective combination of data bits. Specifically, the number N of bits requires $2^N$ distinct threshold voltage levels. For example, for a flash memory cell to store 2 bits of data, 4 distinct threshold voltage levels corresponding to bit states 00, 01, 10, and 11 are needed. When reading the state of the memory cell, the threshold voltage level for which the memory cell 14 conducts current corresponds to a combination of bits representing data programmed into the cell. The two or more bits stored in each flash memory cell 14 can be adjacent bits in the same page of data. However, more frequently, one bit is treated as a bit in one page of data, and the other bit is treated as the corresponding bit in an adjacent page of data. The bit states assigned to respective charge levels are normally the same for all rows of memory cells in an array. The bit states assigned to the flash memory cells in the array are usually implemented in hardware and thus cannot be changed during operation of the flash memory device.

A multi-level flash memory cell is programmed by applying a programming voltage to the control gate and holding the drain to a constant voltage over a proper time period to store enough charge in the floating gate to move the threshold voltage $V_t$ of the flash memory cell 14 to a desired level. This threshold voltage level $V_t$ represents a bit state of the cell corresponding to the combination of data bits stored in the cell. As with programming single-level flash cells, programming of multi-level cells is performed on a row-by-row basis.

FIG. 2A illustrates the cell data map for a conventional one-bit-per-cell flash cell. As shown in FIG. 2A, two separate charge levels or ranges are defined within the overall flash cell threshold voltage $V_t$ range. When reading from such a flash cell, all that is necessary is to determine whether the threshold voltage $V_t$ is above or below the midpoint between the two levels. Voltages in one level are interpreted as a single binary bit (zero or one) while voltages in the other level are interpreted as the complementary binary bit (one or zero).

FIG. 2B, on the other hand, illustrates the cell data map for a multi-level flash memory cell capable of storing two bits. As can be seen in FIG. 2B, the data map defines four separate charge ranges or levels (Levels 0, 1, 2, and 3) within the range of the cell's overall maximum threshold voltage $V_t$. Each level is assigned a two-bit pair or bit-set 00, 01, 10, or 11. The bit sets are assigned for increasing levels of stored charge as 11, 01, 00, 10 so that only a single bit changes with each incremental increase in stored charge. The multiple bits stored in each row can be used as adjacent bits in a single page of memory. Alternatively, the multiple bits stored in each row can be used as corresponding bits in two different pages of memory. For example, the data bits X,Y stored in the first column can be used so that X is the first data bit of one page, and Y is the first data bit of an adjacent page.

As a result of the very large number of components in high capacity memory devices, including flash memory devices, it is not economically feasible to manufacture memory devices without any defects. If one allows memory devices to be manufactured with a few defective memory cells, the price of the memory device can be substantially reduced since much greater manufacturing yield can be attained. After manufacture, defective rows or columns of cells are detected during testing, and repair solutions incorporated into the memory devices themselves are used to perform repair these defects. In a NAND memory device, bit state errors in one or more memory cells in a row are normally corrected by conventional error checking and correcting ("ECC") circuitry included in the memory device or a memory controller connected to the memory device. In the case of a larger number of errors in a row, such as those resulting from row-to-row shorts, the block containing the row is normally tagged as being defective, and a redundant block is substituted for the defective block. Column-to-column shorts are normally repaired by substituting a redundant column of memory cells for each defective column.

There is also a limit to the precision with which circuitry can store an analog value on the floating gate of a flash cell, particularly where multiple levels of charge must be stored. In particular, because of process variations, the flash cells across an entire array and even across a single row may not all behave identically. For these reasons, conventional circuitry for programming or erasing the flash cells typically perform these tasks in an iterative manner. Specifically, the circuitry applies a programming pulse having an appropriate duration and magnitude to a word select line 30. The pulse is applied to the control gate of each of the cells 14 to charge the floating gate to target levels corresponding to bit state values to which the cells are to be programmed. The cells are then interrogated to verify that the floating gate of each cell has been charged to that level. If the floating gate of a cell has been sufficiently charged, the voltage applied to the bit line for the cell is altered so that the floating gate will not be further charged if additional programming pulses are applied to the floating gate. The circuitry again applies a programming pulse to the control gate of each of the cells, and the cells are again verified. This process is repeated until the floating gates have been charged to the target levels. As can be appreciated, it can require a considerable period of time to program flash memory cells in this iterative manner. Additionally, each time the programming pulse is applied to a word select line 30, the pulse can inadvertently couple charge to floating gates of the programmed memory cells 14 in the corresponding row or an adjacent row. This problem is particularly acute for multi-level flash memory cells.

One approach to preventing an excessive number of programming pulses from being applied to a row is to simply consider the row to be properly programmed when the proper programming of less than all of the memory cells in the row have been verified. Using this technique, a "pseudo pass" condition is considered to exist even though one or more of the memory cells are programmed to erroneous bit states. These bit state errors can be corrected when the row is read using the conventional ECC techniques described above. However, these conventional ECC techniques are usually limited to repairing a relatively small number of data bit errors in each row. As a result of the large number of memory cells in the rows of conventional memory devices, the number of data bit errors existing after one or a few programming pulses have been applied to a row can exceed the number of data bit errors that can be corrected by ECC circuitry. To reduce the number of data bit errors to a level that can be corrected by the ECC circuitry, it is sometimes necessary to apply a long sequence of programming pulses to the word select line of a row of memory cells being programmed. For example, if the ECC circuitry is capable of correcting up to four data errors, programming pulses are applied until the number of programming errors has been reduced to four. As explained above, this can adversely affect the programmed state of previously programmed cells. Although this problem is described in the context of flash memory devices, it also exists in other types of non-volatile memory devices.

There is, therefore, a need for a flash memory device that allows a larger number of data bit errors to be corrected in each row of memory cells, thereby reducing the number of required programming pulses and/or allowing the data bit errors to be corrected by conventional ECC techniques.

DETAILED DESCRIPTION

Figure 1:
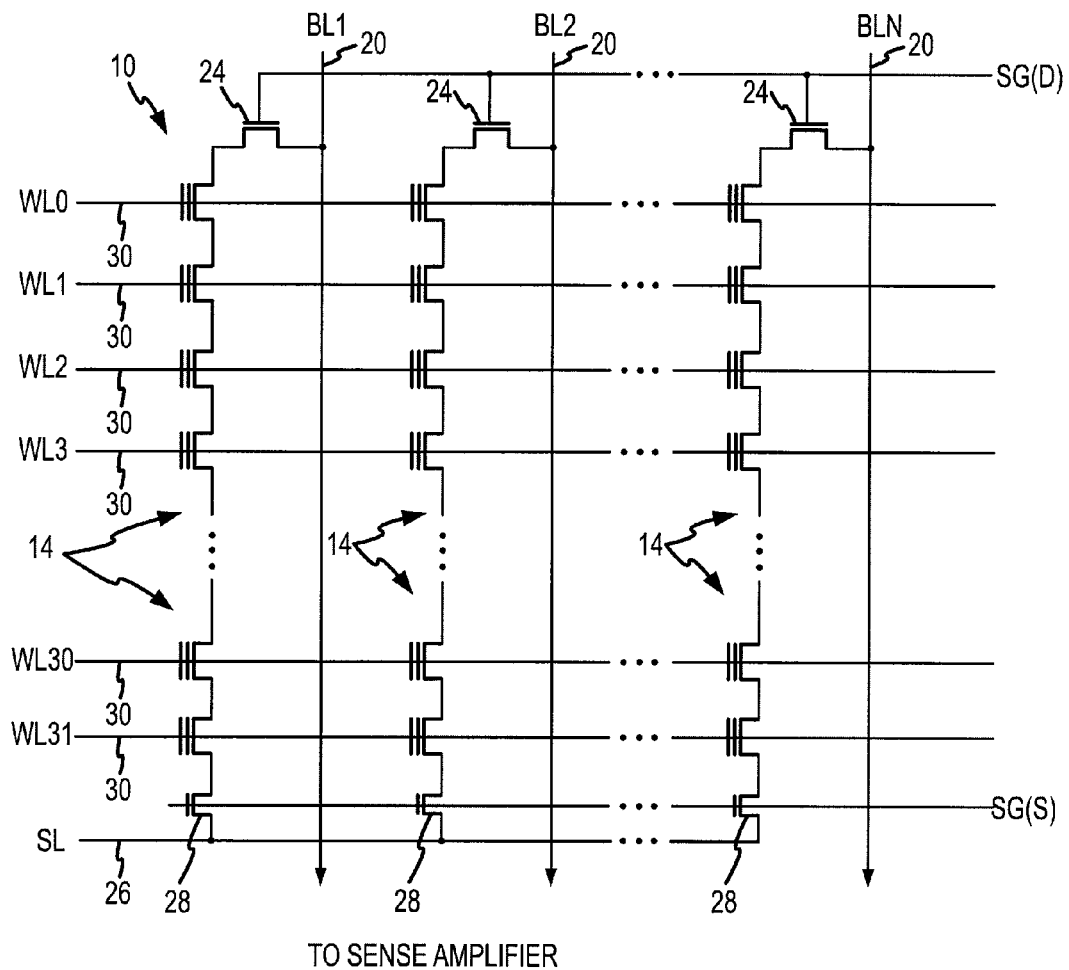
FIG. 1 is a schematic diagram showing a conventional NAND array of flash memory cells.
Figure 2A:
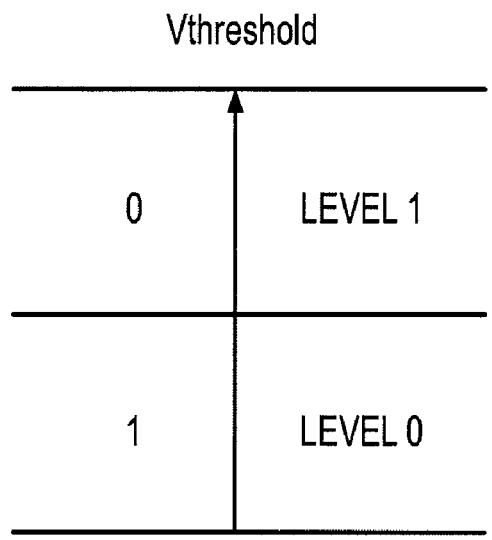
FIGS. 2A and 2B are schematic diagrams illustrating the manner in which the flash cells shown in FIG. 1 are programmed to store one or more data bits.
Figure 2B:
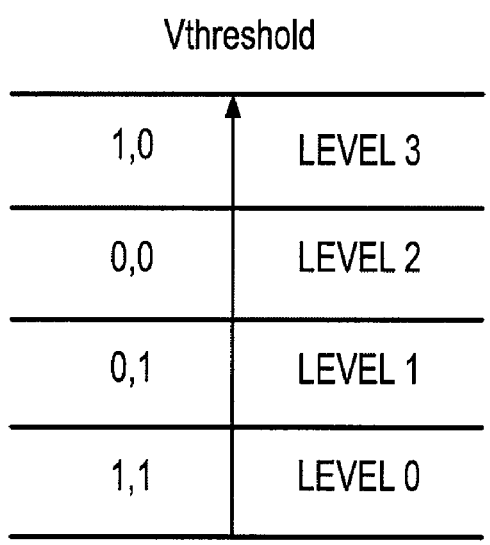
Figure 3:
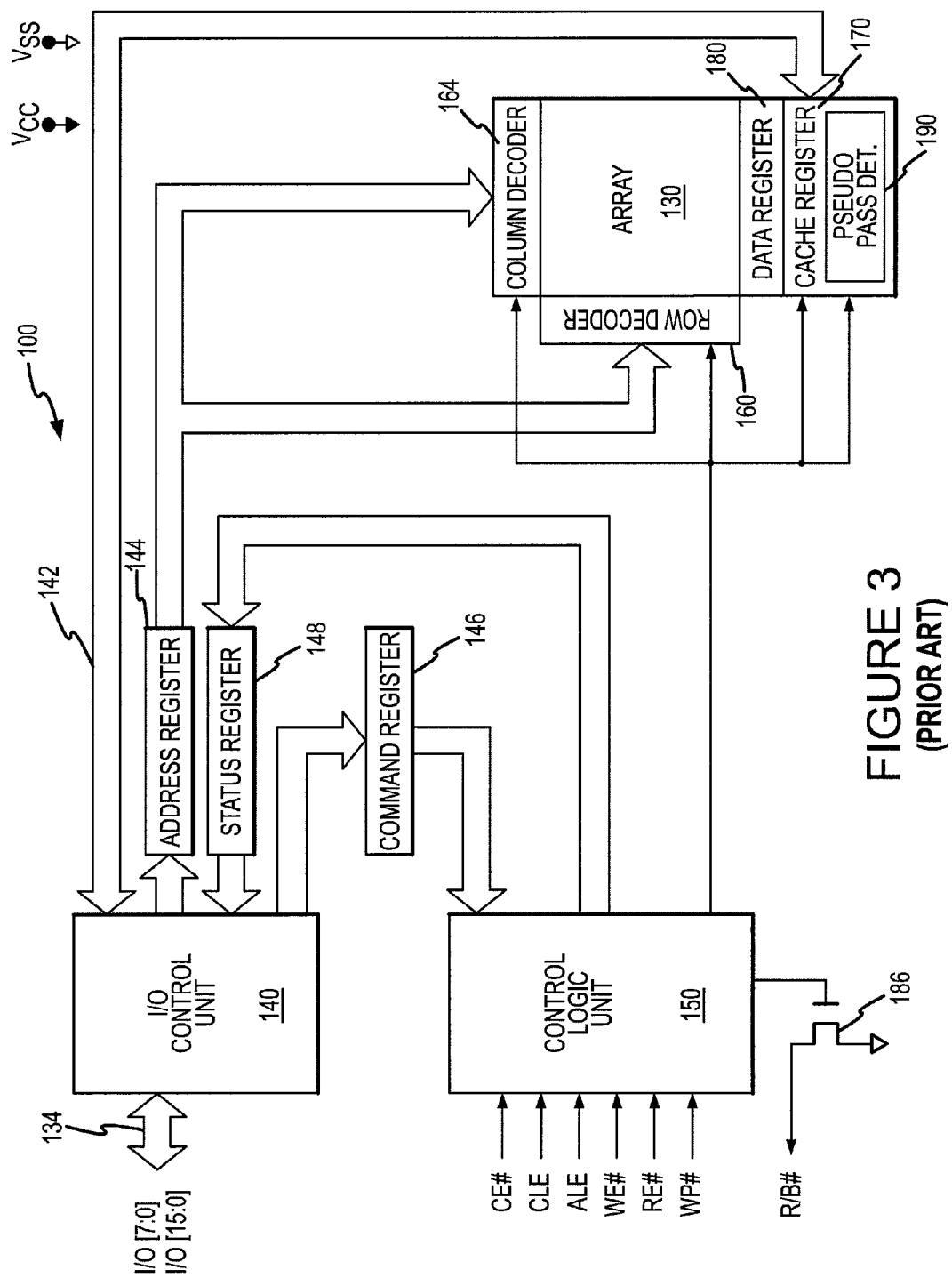
FIG. 3 is a block diagram showing a flash memory device that may be used according to one example of the invention.

A flash memory device 100 of conventional design that can be used according to one example of the invention is shown in FIG. 3. The flash memory device 100 includes an array 130 of flash memory cells arranged in banks of rows and columns. The flash memory cells in the array 130 have their control gates coupled to word select lines, drain regions coupled to local bit lines, and source regions selectively coupled to a ground potential as shown in FIG. 1.

Unlike conventional dynamic random access memory ("DRAM") devices and static random access memory ("SRAM") devices, command, address and write data signals are not applied to the flash memory device 100 through respective command, address and data buses. Instead, most command signals, the address signals and the write data signals are applied to the memory device 100 as sets of sequential input/output ("I/O") signals transmitted through an I/O bus 134. Similarly, read data signals are output from the flash memory device 100 through the I/O bus 134. The I/O bus is connected to an I/O control unit 140 that routes the signals between the I/O bus 134 and an internal data bus 142, an address register 144, a command register 146 and a status register 148.

The flash memory device 100 also includes a control logic unit 150 that receives a number of control signals, including an active low chip enable signal CE#, a command latch enable signal CLE, an address latch enable signal ALE, an active low write enable signal WE#, an active low read enable signal RE#, and an active low write protect WP# signal. When the chip enable signal CE# is active low, command, address and data signals may be transferred between the memory device 100 and a memory access device (not shown). When the command latch enable signal CLE is active high and the ALE signal is low, the control logic unit 150 causes the I/O control unit 140 to route signals received through the I/O bus 134 to the command register 146 responsive to the rising edge of the WE# signal. Similarly, when the address latch enable signal ALE is active high and the CLE signal is low, the I/O control unit 140 routes signals received through the I/O bus 134 to the address register 146 responsive to the rising edge of the WE# signal. The write enable signal WE# is also used to gate write data signals from the memory access device (not shown) to the memory device 100, and the read enable signal RE# is used to gate the read data signals from the memory device 100 to the memory access device (not shown). The I/O control unit 140 transfers the write data signals and read data signals between the I/O bus 134 and the internal data bus 142 when the CLE and ALE signals are both low. Finally, an active low write protect signal WP# prevents the memory device 100 from inadvertently performing programming or erase functions. The control logic unit 150 is also coupled to the internal data bus 142 to receive write date from the I/O control unit for reasons that will be explained below.

The status register 148 can be read responsive to a read status command. After the read status command, all subsequent read commands will result in status data being read from the status register 148 until a subsequent read status command is received. The status data read from the status register 148 provides information about the operation of the memory device 100, such as whether programming and erase operations were completed without error.

The address register 146 stores row and column address signals applied to the memory device 100. The address register 146 then outputs the row address signals to a row decoder 160 and the column address signals to a column decoder 164. The row decoder 160 asserts word select lines 30 (FIG. 1) corresponding to the decoded row address signals. Similarly, the column decoder 164 enables write data signals to be applied to bit lines for columns corresponding to the column address signals and allow read data signals to be coupled from bit lines for columns corresponding to the column address signals.

In response to the memory commands decoded by the control logic unit 150, the flash memory cells in the array 130 are erased, programmed, or read. The memory array 130 is programmed on a row-by-row or page-by-page basis. After the row address signals have been loaded into the address register 146, the I/O control unit 140 routes write data signals to a cache register 170. The write data signals are stored in the cache register 170 in successive sets each having a size corresponding to the width of the I/O bus 134. The cache register 170 sequentially stores the sets of write data signals for an entire row or page of flash memory cells in the array 130. All of the stored write data signals are then used to program a row or page of memory cells in the array 130 selected by the row address stored in the address register 146. In a similar manner, during a read operation, data signals from a row or page of memory cells selected by the row address stored in the address register 146 are stored in a data register 180. Sets of data signals corresponding in size to the width of the I/O bus 134 are then sequentially transferred through the I/O control unit 140 from the data register 180 to the I/O bus 134. Although the array 130 is typically read on a row-by-row or page-by-page basis, a selected portion of a selected row or page may be read by specifying a corresponding column address.

The flash memory device 130 also includes an NMOS transistor 186 having its gate coupled to receive a signal from the control logic unit 150. When the memory device 100 is busy processing a programming, erase or read command, the control logic unit 150 outputs a high signal to cause the transistor 186 to output an active low read/busy signal R/B#. At other times, the transistor 186 is turned OFF to indicate to a memory access device that the device 100 is able to accept and process memory commands.

As explained above, during a write operation, the control logic unit 150 causes the write data signals stored in the cache register 170 to program a row or page of memory cells in the array 130. As also explained above, this is accomplished in an iterative manner in which the control logic unit 150 repetitively performs program and verify operations. To determine when a sufficient number of memory cells in a row or page have been properly programmed, the cache register 170 includes a pseudo pass detector 190. The pseudo pass detector 190 outputs a signal to the control logic unit 150 when a sufficient number of cells have been programmed that programming of the row or page can be considered complete.

Figure 4:
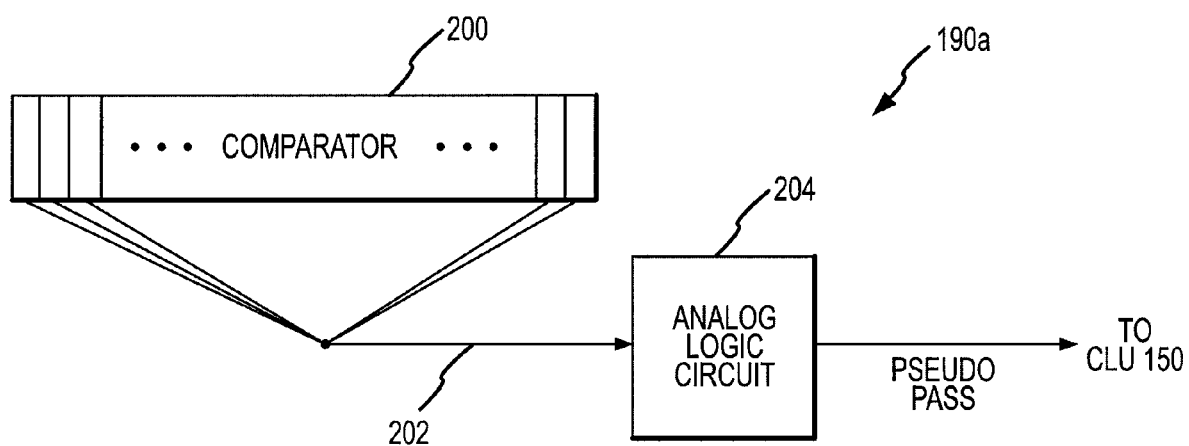
FIG. 4 is a block diagram of one example of a conventional pseudo pass detector that has been used in the flash memory device of FIG. 3.

A pseudo pass detector 190a of conventional design is shown in FIG. 4. The detector 190a includes a comparator 200 having a plurality of comparator stages, one of which is provided for each data signal stored in the cache register 170. One of the inputs of each stage receives a respective one of the data signals stored in the cache register 170, and the other input of the stage receives a corresponding data signal read from a row of memory cells during verification. The respective stages of the comparator 200 thus compare each read data signal stored in the cache register 170 to the data signal stored in a corresponding memory cell in the row being programmed to determine if the cell has been properly programmed. If the data signal stored in a memory cell does not match the corresponding read data signal stored in the cache register 170, the corresponding stage of the comparator 200 outputs a current signal that draws a predetermined amount of current from a common output line 202. If a stage of the comparator 200 determines there is a match, it does not output a current signal but instead leaves its output isolated or tri-stated.

The current signals from all of the stages of the comparator 200 are applied through the common line 202 to an analog logic circuit 204. The analog logic circuit 204 generate a pseudo pass bit indicative of whether or not the number of improperly programmed memory cells exceed a predetermined number. The analog logic circuit 204 performs this function by outputting a pseudo pass bit having one binary value if the total current drawn by all the current signals from the respective stages of the comparator 200 do not exceed a predetermined value, and a different binary value if the total current drawn exceeds the predetermined value. The analog logic circuit 204 may be implemented, for example, by biasing a node high through a fixed resistance and detecting when the total current draw from the comparators 200 is sufficient to pull the voltage of the node below a predetermined threshold voltage.

In one example, the analog logic circuit 204 outputs a low pseudo pass bit to the control logic unit 150 as long as the number of improperly programmed memory cells is less than 5, i.e., 4. In response, the control logic unit 150 terminates, repetitively programming and verifying the data being stored in the row of memory cells being programmed. The 4 or fewer erroneous data signals can then be corrected by conventional ECC circuitry (not shown) in the memory device 100 or in a flash memory controller (not shown) connected to the memory device 100. However, if the number of improperly programmed memory cells is 5 or greater, the analog logic circuit 204 outputs a high pseudo pass bit. The control logic unit 150 can then continue to repetitively program and verify the data being stored in the row of memory cells being programmed.

The conventional pseudo pass detector 190a uses an analog logic circuit 204 rather than a set of logic gates because the large number of signals that it receives, typically in the thousands, would require a large number of logic gates. The required number of logic gates would consume a great deal of space on an integrated circuit chip, and might draw a significant amount of power. The analog logic circuit 204 can be implemented with significantly less circuitry and draw significantly less power. However, the logic function performed by the analog logic circuit 204 can easily be implemented by digital means in a manner that will be apparent to one skilled in the art.

One problem with the conventional pseudo pass detector 190a shown in FIG. 4 is that it may cause the control logic unit 150 to perform more program and verify operations than are actually necessary to reduce the number of data errors to a level that can be corrected by ECC circuitry. More specifically, the data stored in the memory array 130 are often read from the memory device 100 in sets of 512 bytes, which correspond to a sector of a hard disk drive. However, regardless of whether this is the case, the data will be read from the memory device in sets that are smaller than the number of data signals stored in each row or page of memory cells in the array 130. For example, if the rows in the array 130 store 2048 data signals, the data will be read from the row in four sets of 512 bytes. By not generating the pseudo pass signal until the number of data bit errors has been reduced to 4, the maximum number of erroneous bits read from the row will always be 4 or fewer, and these can be corrected by the ECC circuitry. However, in some cases, depending upon the pattern of the errors, the ECC circuitry could correct more than 4 erroneous data bits stored in a row or page. For example, if there are 3 erroneous bits in each of the sets of 512 bytes, the ECC circuitry would receive a maximum of 3 erroneous data bits from any one set. Therefore, the ECC circuitry could easily correct these bits even though there would be a total of 12 erroneous bits in the entire row or page. Unfortunately, the control logic unit 150 would unnecessarily continue to perform program and verify operations until the total number of erroneous bit errors was reduced to 4. These unnecessary program and verify operations could corrupt the data stored in previously programmed cells for the reasons previously explained. On the other hand, if the number of bit errors was not limited to 4, and there were just 6 bit errors present in the same set of 512 bytes, these bits could not be corrected by the ECC circuitry since it would simultaneously receive more than 4 erroneous bits. As a result, program and verify operations must be performed to reduce the number of erroneous bits to 4 or less, even though doing so is sometimes unnecessary. For these reasons, a memory device 100 using the conventional pseudo pass detector 190a may require more time than actually needed to program a row or page. Additionally, because of data corruption caused by an excessive number of programming pulses, the data stored in a row may become corrupted to the extent that they could not be corrected by ECC circuitry.

Figure 5:
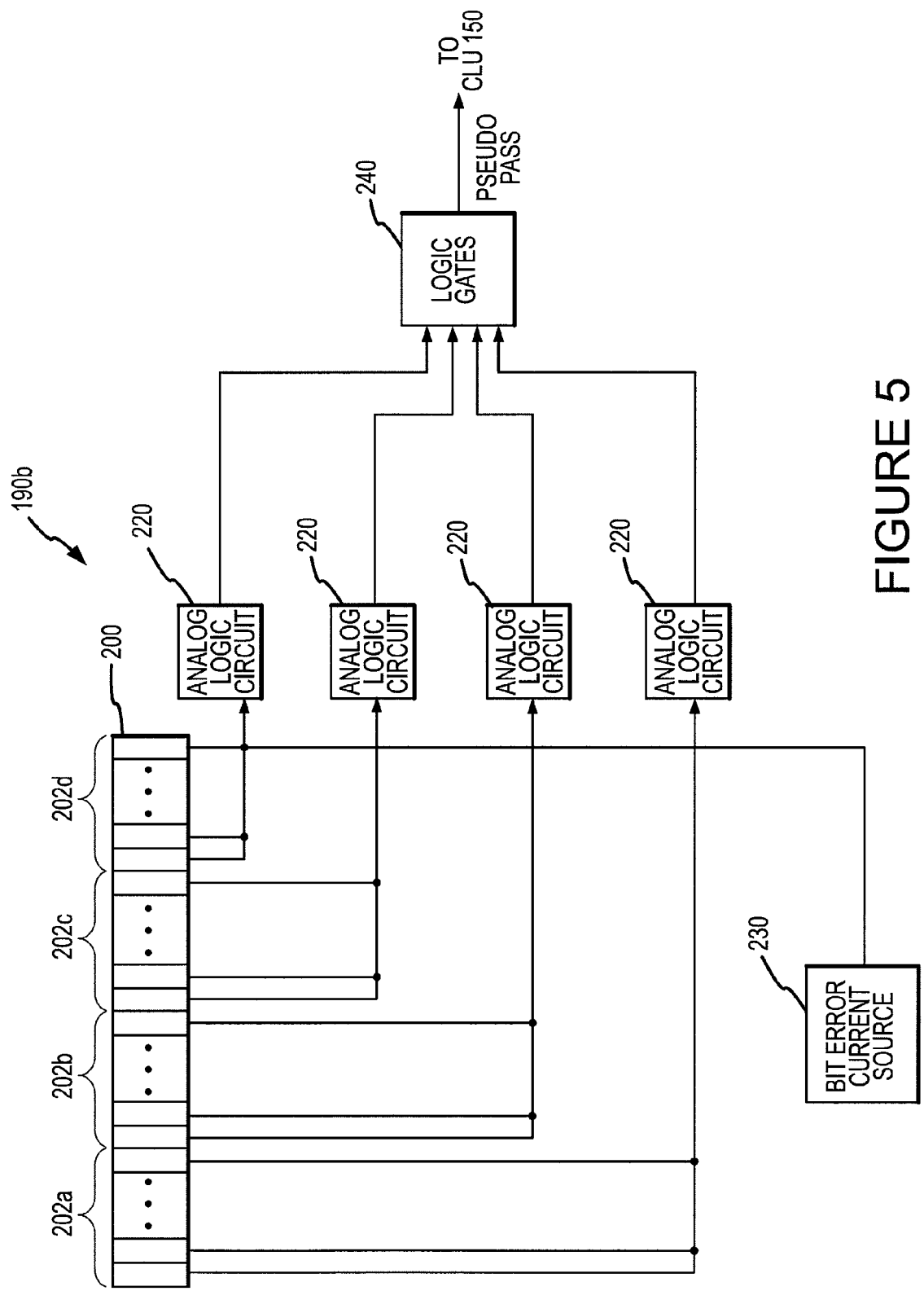
FIG. 5 is a block diagram of a pseudo pass detector according to one example of the invention that may be used in the flash memory device of FIG. 3.

A pseudo pass detector 190b according to one example of the invention, is shown in FIG. 5. The pseudo pass detector 190b differs from the conventional pseudo pass detector 190a by performing its comparison operations on subsets of data signals stored in the cache register 170. In one example of the invention, the number of data signals in each subset is equal to the number of read data signals in each set output from the memory device 100. The pseudo pass detector 190b includes the same comparator 200 that is used in the pseudo pass detector 190a of FIG. 1. However, the match signals from groups 202a-d of stages of the comparator 200 are processed separately. In the example shown in FIG. 5, the stages of the comparator 200 are divided into 4 groups, 202a-d, each of which contains 512 stages. The current signals from the stages in each group are applied to respective analog logic circuits 220. The analog logic circuits 220 each compare the current drawn by the stages of the comparator 200 to which it is coupled to a current reference signal generated by a bit error current source 230. The bit error current source 230 generates a current corresponding to the maximum number of data errors that are considered acceptable in the corresponding subset of data signals. The same bit error current source 230 may be used for all of the signal groups 202a-d, as shown in FIG. 5, or a respective bit error current source 230 may be provided for each group of stages, 202a-d, of the comparator 200. The comparator 200 and analog logic circuits 220 for each group 202a-d operate in essentially the same manner as the comparator 200 and analog logic circuit 204 except that the current to which the currents drawn by the comparator stages is generated by the bit error current source. Each analog logic circuit 220 outputs a respective pass signal whenever the number of errors in the data bits from the corresponding group of comparator stages is within the number of data errors that can be corrected by ECC circuitry (not shown). These pass signals from all of the analog logic circuits 220 are applied to logic gates 240. The logic gates 240 output a pseudo pass signal to the control logic unit 150 whenever all of the analog logic circuits 220 224 are outputting respective pass signals. Therefore, the control logic unit 150 will continue to perform program and verify operations until the number of errors in each set of data signals is within the number that can be corrected by ECC circuitry. However, the total number of errors in the data stored in an entire row or page can be well in excess of the number of errors that can be corrected by ECC circuitry.

In one example of the invention, each row of cells in the array stores 2048 bytes of data, and the data bytes are transferred from the memory device 100 in sets of 512 bytes. These data bytes are transferred to a flash memory controller (not shown) that can correct 4 or fewer data bit errors. The current output from the bit error current source 230 thus corresponds to 4 bit errors.

Figure 6:
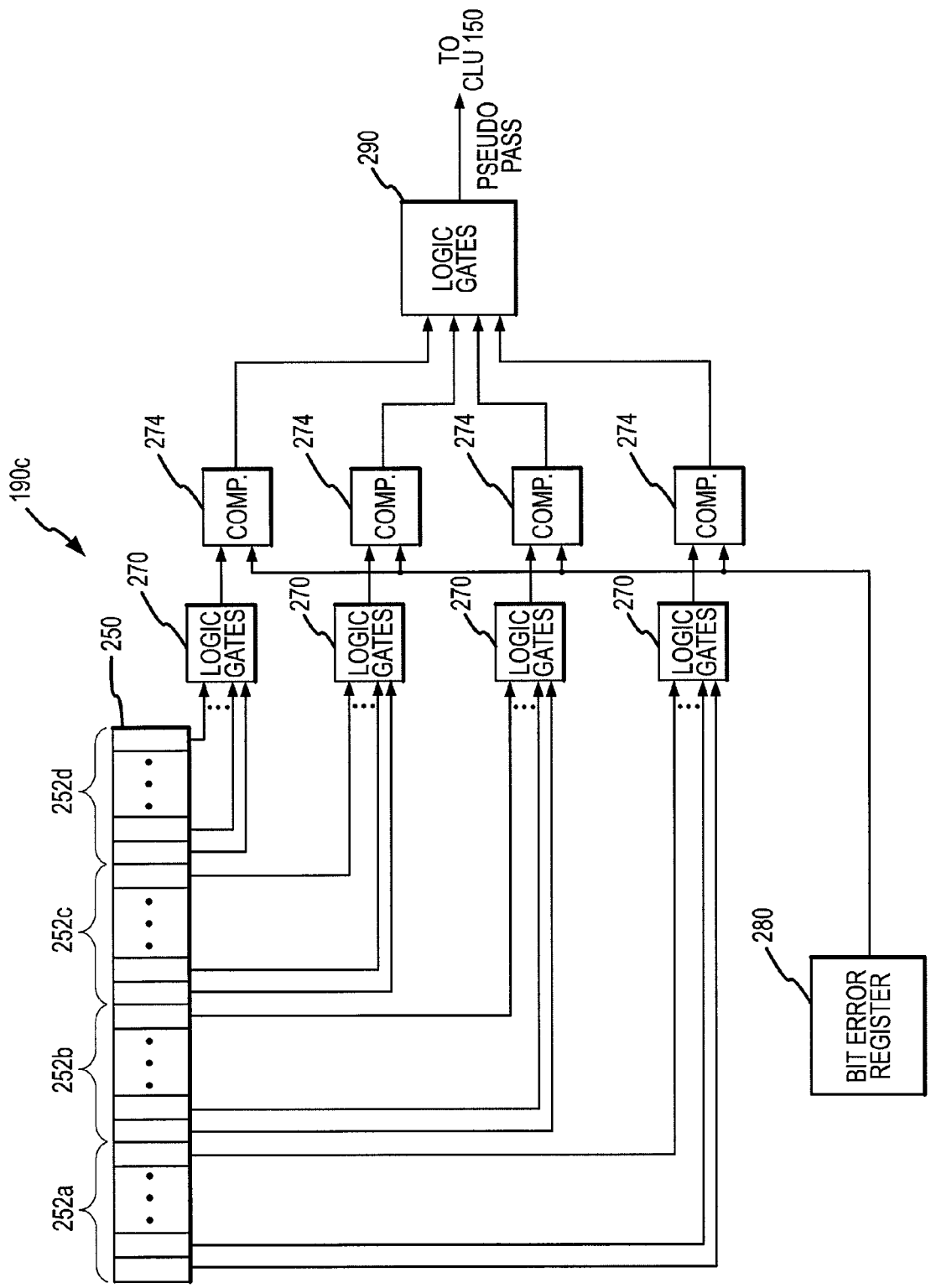
FIG. 6 is a block diagram of a pseudo pass detector according to another example of the invention that may be used in the flash memory device of FIG. 3.

A pseudo pass detector 190c, according to another example of the invention, is shown in FIG. 6. The pseudo pass detector 190c differs from the pseudo pass detector 190b and conventional pseudo pass detector 190a by performing its comparison operations digitally rather than by analog means. The pseudo pass detector 190b includes a comparator 250 that outputs a digital match signal from each stage if the data signal stored in a corresponding memory cell matches the corresponding read data signal stored in the cache register 170. In the example shown in FIG. 6, the stages of the comparator 250 are divided into 4 groups, 252a-d, each of which contains 512 stages. The match signals from the stages in each group are applied to respective logic gates 270 that generate a plurality of bits specifying the number of data errors in the corresponding subset of data signals. These bits are applied to a respective comparator 274 that compares the number to a number indicated by bits from a bit error register 280. The same bit error register 280 may be used for all of the signal groups 252a-d, as shown in FIG. 6, or a respective bit error register 280 may be provided for each group of stages, 252a-d, of the comparator 250. Each comparator 274 outputs a respective pass signal whenever the number of errors in the data bits from the corresponding group of stages is within the number of data errors that can be corrected by ECC circuitry (not shown). However, the pseudo pass detector 190c also includes a set of logic gates 290 that receive the pass signals from the comparator 274 for each group of stages of the comparator 250. The logic gates 290 output a pseudo pass signal to the control logic unit 150 whenever all of the comparators 274 are outputting respective pass signals. Therefore, the control logic unit 150 will continue to perform program and verify operations until the number of errors in each set of data signals is within the number that can be corrected by ECC circuitry. However, the total number of errors in the data stored in an entire row or page can be well in excess of the number of errors that can be corrected by ECC circuitry.

In one example of the invention, each row of cells in the array stores 2048 bytes of data, and the data bytes are transferred from the memory device 100 in sets of 512 bytes. These data bytes are transferred to a flash memory controller (not shown) that can correct 4 or fewer data bit errors. The number 4 is therefore stored in the bit error register 280.

Figure 7:
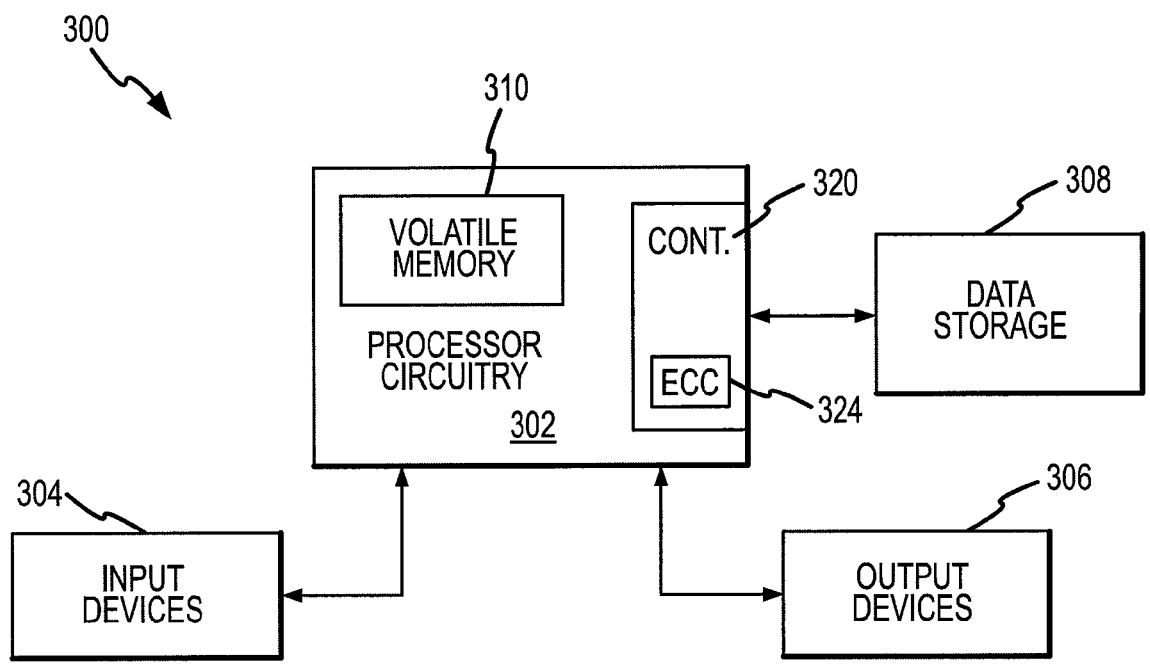
FIG. 7 is a simplified block diagram of a processor-based system including the flash memory device of FIG. 3 or another flash memory device using a pseudo pass detector according to an example of the invention.

FIG. 7 is a block diagram of a processor-based system 300 including processor circuitry 302 having volatile memory 310. The processor circuitry 302 is coupled through address, data, and control buses to the volatile memory 310 to provide for writing data to and reading data from the volatile memory 310. The processor circuitry 302 includes circuitry for performing various processing functions, such as executing specific software to perform specific calculations or tasks. The processor-based system 300 also includes one or more input devices 304 coupled to the processor circuitry 302 to allow an operator to interface with the processor-based system 300. Examples of input devices 304 include keypads, touch screens, and scroll wheels. The processor-based system 300 also includes one or more output devices 306 coupled to the processor circuitry 302 to provide output information to the operator. In one example, the output device 306 is a visual display providing visual information to the operator. Data storage 308 is also coupled to the processor circuitry 302 through a controller 320 to store data that is to be retained even when power is not supplied to the processor-based system 300 or to the data storage 308. The flash memory device 100, or a flash memory device according to some other example of the invention, can be used for the data storage 308, and a flash memory controller can be used for the controller 320. The controller 320 includes ECC circuitry 324 for correcting errors in data read from the flash memory device used for the data storage 308, as previously explained.

Although the present invention has been described with reference to the disclosed embodiments, persons skilled in the art will recognize that changes may be made in form and detail without departing from the spirit and scope of the invention. For example, although the pseudo pass detectors 190b,c have been explained in the context of flash memory devices, they may also be used in other types of non-volatile memory devices. Such modifications are well within the skill of those ordinarily skilled in the art. Accordingly, the invention is not limited except as by the appended claims.

I claim:

1. In a non-volatile memory device having an array of memory cells arranged in rows and columns, a method of programming a row of non-volatile memory cells in the array, comprising:
   programming the memory cells in the row;
   verifying the programming of the memory cells by determining if the memory cells in each of a plurality of subsets of the memory cells in the row are properly programmed;
   determining if more than a predetermined number of memory cells are not properly programmed in any of the subsets; and
   in response to determining that more than a predetermined number of memory cells are not properly programmed in any of the subsets, repeating the programming and verifying of the memory cells in the row.

2. The method of claim 1 wherein the act of determining if more than a predetermined number of memory cells are not properly programmed in any of the subsets comprises, for each subset:
   determining the number of memory cells in the subset that are not properly programmed; and
   comparing the determined number of memory cells that are not properly programmed to the predetermined number.

3. The method of claim 2 wherein the act of determining the number of memory cells in the subset that are not properly programmed comprises:
   providing a respective pass signal indicative of whether or not each memory cell in the subset is properly programmed; and
   processing the pass signals to provide a first plurality of bits indicative of the number of memory cells that are not properly programmed.

4. The method of claim 3 wherein the act of comparing the determined number of memory cells that are not properly programmed to the predetermined number comprises:
   providing a second plurality of bits indicative of the predetermined number; and
   comparing the number indicated by the first plurality of bits to the number indicated by the second plurality of bits.

5. The method of claim 1 wherein the act of repeating the programming and verifying of the memory cells in the row in response to determining that more than a predetermined number of memory cells are not properly programmed in any of the subsets comprises repeating the programming and verifying of the memory cells in the row until the number of memory cells that are not properly programmed is no longer greater than the predetermined number in any of the subsets.

6. The method of claim 1 further comprising reading data from the non-volatile memory device, the number of read data bits output from the non-volatile memory device being equal to the number of data bits stored in each of the subsets of memory cells.

7. In a processor-based system having a processor coupled to a non-volatile memory device having an array of memory cells arranged in rows and columns, the processor-based system further having error checking and correcting circuitry structured to check and correct subsets of data read from the non-volatile memory device, a method of programming a row of memory cells in the array, comprising:
   programming the memory cells in the row;
   determining if the memory cells in each of a plurality of subsets of the memory cells in the row are properly programmed, each of the subsets of the memory cells storing respective ones of the subsets of data read from the non-volatile memory device;
   determining if more than a predetermined number of memory cells in any of the subsets are not properly programmed; and
   in response to determining that more than a predetermined number of memory cells in any of the subsets are not properly programmed, repeating the programming of the memory cells in the row.

8. The method of claim 7 wherein the act of determining if more than a predetermined number of memory cells are not properly programmed in any of the subsets comprises, for each subset:
   determining the number of memory cells in the subset that are not properly programmed;
   comparing the determined number of memory cells that are not properly programmed to the predetermined number.

9. The method of claim 8 wherein the act of determining the number of memory cells that are not properly programmed in the subset comprises:
   providing a respective pass signal indicative of whether or not each memory cell in the subset is properly programmed; and
   processing the pass signals to provide a first plurality of bits indicative of the number of memory cells that are not properly programmed.

10. The method of claim 9 wherein the act of comparing the determined number of memory cells that are not properly programmed to the predetermined number comprises:
    providing a second plurality of bits indicative of the predetermined number; and
    comparing the number indicated by the first plurality of bits to the number indicated by the second plurality of bits.

11. The method of claim 7 wherein the act of repeating the programming and verifying of the memory cells in the row in response to determining that more than a predetermined number of memory cells are not properly programmed in any of the subsets comprises repeating the programming and verifying of the memory cells in the row until the number of memory cells that are not properly programmed is no longer greater than the predetermined number in any of the subsets.

12. The method of claim 7 wherein the processor-based system further comprises a non-volatile memory controller connected to the processor and the non-volatile memory device, and wherein the error checking and correcting circuitry is located in the non-volatile memory controller.

13. The method of claim 7 wherein the error checking and correcting circuitry is structured to correct a maximum of a predetermined number of bits in each of the sets of data read from the non-volatile memory device, and wherein the predetermined number of memory cells is equal to the predetermined number of bits.

14. The method of claim 7 further comprising reading data from the non-volatile memory device, the number of read data bits output from the non-volatile memory device being equal to the number of data bits stored in each of the subsets of memory cells.

15. A non-volatile memory device, comprising:
an array of non-volatile memory cells arranged in rows and columns; and
a control logic unit coupled to the array of non-volatile memory cells, the control logic unit being operable to carry out operations in the array corresponding to a memory command at a location in the array corresponding to a memory address, the operations including programming memory cells in each row of the array and verifying the programming of the memory cells by determining if each of the memory cells in each of a plurality of subsets of the memory cells in the row are properly programmed, the control logic unit further operable to repeat programming and verifying of the memory cells in a row in response to determining that more than a predetermined number of memory cells are not properly programmed in any of the subsets.

16. The non-volatile memory device of claim 15, further comprising:
a register structured to store write data for programming a row of memory cells in the array;
a comparator structured to compare each bit of write data stored in the register with a corresponding bit of data stored in a row of memory cells in the array as a result of attempting to program the row of memory cells with the write data stored in the register, the comparator being structured to generate a respective match signal indicative of whether each bit of write data stored in the register matches the corresponding bit of data stored in the row of memory cells in the array; and
a logic circuit coupled to receive the match signals from the comparator, the logic circuit being operable to generate for each of a plurality of subsets of bits of write data stored in the memory cells in the row a respective pass signal indicative of whether or not each memory cell in the subset is properly programmed and being further operable to process the pass signals to determine the number of memory cells that are not properly programmed, the logic circuit structured to generate a pseudo pass signal indicative of more than a predetermined number of memory cells that are not properly programmed in at least one of the subsets until the number of memory cells that are not properly programmed is no longer greater than the predetermined number in any of the subsets.

17. The non-volatile memory device of claim 16 wherein the logic circuit comprises an analog logic circuit.

18. The non-volatile memory device of claim 16 wherein the logic circuit comprises a digital logic gate.

19. The non-volatile memory device of claim 16 wherein the control logic unit is coupled to receive the pseudo pass signal from the logic circuit, and wherein the control logic unit is structured to repeatedly program and verify the memory cells in the row until the pseudo pass signal is generated by the logic circuit.

20. The non-volatile memory device of claim 16 wherein the logic circuit generates respective first sets of signals corresponding to the number of match signals received for each of the subsets of bits of write data, and wherein the logic circuit comprises:
a register storing and outputting a second set of signals corresponding to the predetermined number of match signals; and
a second comparator comparing the second set of signals to each of the first sets of signals.

21. The non-volatile memory device of claim 15 wherein read data bits are output from the non-volatile memory device, the number of read data bits output from the non-volatile memory device being equal to the number of data bits stored in each of the subsets of memory cells.

22. A processor-based system, comprising:
a processor operable to process data and to provide memory commands and addresses;
an input device coupled to the processor;
an output device coupled to the processor; and
a non-volatile memory device, comprising:
an array of non-volatile memory cells arranged in rows and columns; and
a control logic unit coupled to the array of non-volatile memory cells, the control logic unit being operable to carry out operations in the array corresponding to a memory command at a location in the array corresponding to a memory address, the operations including programming memory cells in each row of the array and verifying the programming of the memory cells by determining if each of the memory cells in each of a plurality of subsets of the memory cells in the row are properly programmed, the control logic unit further operable to repeat programming and verifying of the memory cells in a row in response to determining that more than a predetermined number of memory cells are not properly programmed in any of the subsets.

* * * * *

UNITED STATES PATENT AND TRADEMARK OFFICE
CERTIFICATE OF CORRECTION

PATENT NO. : 7,961,522 B2  
APPLICATION NO. : 12/505886  
DATED : June 14, 2011  
INVENTOR(S) : Frankie Roohparvar Page 1 of 1

It is certified that error appears in the above-identified patent and that said Letters Patent is hereby corrected as shown below:

On the title page, item (75), in column 1, line 1, delete "Monte Soreno," and insert -- Monte Sereno, --, therefor.

In column 12, line 19, in Claim 7, delete "subsets" and insert -- sets --, therefor.

Signed and Sealed this  
Ninth Day of August, 2011

David J. Kappos  
*Director of the United States Patent and Trademark Office*